United States Patent
Yu et al.

(10) Patent No.: US 9,594,287 B2
(45) Date of Patent: Mar. 14, 2017

(54) SUBSTRATE-LESS FLEXIBLE DISPLAY AND METHOD OF MANUFACTURING THE SAME

(71) Applicant: ROYOLE CORPORATION, Fremont, CA (US)

(72) Inventors: Xiaojun Yu, Fremont, CA (US); Peng Wei, Fremont, CA (US); Ze Yuan, Fremont, CA (US); Zihong Liu, Shenzhen (CN)

(73) Assignee: ROYOLE CORPORATION, Fremont, CA (US)

( * ) Notice: Subject to any disclaimer, the term of this patent is extended or adjusted under 35 U.S.C. 154(b) by 0 days.

(21) Appl. No.: 14/507,608

(22) Filed: Oct. 6, 2014

(65) Prior Publication Data

US 2016/0056217 A1     Feb. 25, 2016

Related U.S. Application Data

(60) Provisional application No. 62/041,127, filed on Aug. 24, 2014.

(51) Int. Cl.
| | |
|---|---|
| *H01L 27/32* | (2006.01) |
| *G02F 1/167* | (2006.01) |
| *H01L 51/52* | (2006.01) |
| *G02F 1/1368* | (2006.01) |
| *H01L 51/00* | (2006.01) |

(Continued)

(52) U.S. Cl.
CPC .......... *G02F 1/167* (2013.01); *B29D 11/0073* (2013.01); *B32B 17/10504* (2013.01); *H01L 51/0097* (2013.01); *G02F 1/1368* (2013.01); *G02F 1/133305* (2013.01); *G02F 1/133345* (2013.01); *G02F 2001/13613* (2013.01); *G02F 2201/501* (2013.01); *G02F 2202/022* (2013.01);

(Continued)

(58) Field of Classification Search
None
See application file for complete search history.

(56) References Cited

U.S. PATENT DOCUMENTS

| | | | |
|---|---|---|---|
| 6,268,695 B1 * | 7/2001 | Affinito | H01L 51/5237 313/504 |
| 7,648,925 B2 * | 1/2010 | Moro | C23C 14/024 257/E21.007 |

(Continued)

FOREIGN PATENT DOCUMENTS

CN     103985823 A     8/2014

OTHER PUBLICATIONS

Royole Corporation, International Search Report and Written Opinion, PCT/US2015/045030, Nov. 9, 2015, 9 pgs.

*Primary Examiner* — Michael Lebentritt
*Assistant Examiner* — Jordan Klein
(74) *Attorney, Agent, or Firm* — Morgan, Lewis & Bockius LLP

(57) ABSTRACT

A substrate-less display device is disclosed. The substrate-less display device includes a barrier stack. The barrier stack includes a plurality of inorganic barrier films and a plurality of polymer films. The inorganic barrier films and the polymer films are alternatively disposed. The substrate-less display device further includes a thin-film-transistor (TFT) device layer disposed on the barrier stack, a display medium layer disposed on the TFT device layer, and an encapsulation layer disposed on the display medium layer.

16 Claims, 13 Drawing Sheets

(51) Int. Cl.
  *H01L 51/56* (2006.01)
  *B29D 11/00* (2006.01)
  *B32B 17/10* (2006.01)
  *G02F 1/1333* (2006.01)
  *G02F 1/136* (2006.01)

(52) U.S. Cl.
  CPC .... *G02F 2202/28* (2013.01); *H01L 2227/326* (2013.01)

(56) References Cited

U.S. PATENT DOCUMENTS

| | | | | |
|---|---|---|---|---|
| 2003/0203210 A1* | 10/2003 | Graff | ................ | H01L 51/0097 428/412 |
| 2005/0046339 A1* | 3/2005 | Ju | ................ | H01L 24/10 313/504 |
| 2005/0174045 A1* | 8/2005 | Lee | ................ | B05D 1/60 313/504 |
| 2006/0216951 A1* | 9/2006 | Moro | ................ | C23C 14/0694 438/778 |
| 2007/0196682 A1* | 8/2007 | Visser | ................ | H01L 23/562 428/594 |
| 2008/0035492 A1* | 2/2008 | Hilliard | ................ | B01D 53/326 205/688 |
| 2009/0191342 A1* | 7/2009 | Chu | ................ | H01L 23/564 427/264 |
| 2010/0119840 A1* | 5/2010 | Padiyath | ................ | B32B 27/08 428/422 |
| 2011/0140115 A1* | 6/2011 | Ahn | ................ | H01L 27/3258 257/59 |
| 2011/0171764 A1* | 7/2011 | Toonen | ................ | B82Y 20/00 438/29 |
| 2012/0161197 A1* | 6/2012 | Im | ................ | B82Y 20/00 257/100 |
| 2013/0241076 A1* | 9/2013 | Mandlik | ................ | H01L 51/5253 257/774 |
| 2013/0285024 A1* | 10/2013 | Ma | ................ | H01L 51/52 257/40 |
| 2014/0042399 A1* | 2/2014 | Park | ................ | H01L 51/52 257/40 |
| 2014/0217356 A1* | 8/2014 | Bayram | ................ | H01L 33/14 257/13 |
| 2014/0217383 A1* | 8/2014 | Park | ................ | H01L 51/56 257/40 |

* cited by examiner

SUBSTRATE-LESS FLEXIBLE DISPLAY AND METHOD OF MANUFACTURING THE SAME

CROSS-REFERENCE TO RELATED APPLICATION

This application claims priority to U.S. Provisional Application No. 62/041,127, entitled "Substrate-Less Flexible Display And The Method Of Manufacturing The Same," filed on Aug. 24, 2014, the content of which is incorporated herein by reference in its entirety.

TECHNICAL FIELD

Example embodiments relate to a display device, and in particular, to a flexible display device without a substrate and a method for manufacturing the same.

BACKGROUND

The flexible display has been considered for the display industry as the next generation of information display technology. Particularly, the flexible active-matrix organic light-emitting diode (AMOLED) display has attracted much interests in the applications such as smart phones, intelligent home systems, wearable electronic devices, etc.

Thin-film transistor (TFT) devices used in an active matrix may be degraded if moisture penetrates into the device layer. For example, moisture may cause the characteristics of a TFT device to deviate from designed range, resulting in a malfunctioned device. Further, organic light-emitting diode (OLED) devices are extremely sensitive to moisture and oxygen. For example, the emission of an OLED device may degrade when OLED materials are exposed to moisture. The highly reactive and low work function cathodes of an OLED device can be easily corroded by moisture and oxygen. Thus, AMOLED display generally needs two substrates to encapsulate the TFT and OLED devices to ensure stable performance of those devices.

Due to its flexibility to bend, plastic substrates have been selected to be the substrates for flexible display panels. In addition, plastic substrates are light weighted and not fragile, and are suitable for roll-to-roll processing. Display panels made with plastic substrates are proved to be durable to mechanical shocks and allow rollable and foldable applications. In some cases, the bending radius is required to be less than 1 mm.

However, plastic substrates are known to be less effective than glass substrates to prevent moisture from coming into the device layer. To combat these drawbacks, several proposals have been implemented. For example, referring to FIG. 1, a stacked layer 104 is provided on a plastic substrate 102 to reduce moisture and oxygen penetrating therethrough. Stacked layer 104 includes a plurality of pairs of stacked films. A pair of stacked films includes a polymer film 106 and an inorganic film 108. For example, in FIG. 1, three pairs of polymer films 106 and inorganic films 108 are provided on plastic substrate 102.

Generally, inorganic films 108 are formed on substrate 102 by sputtering, plasma enhanced chemical vapor deposition (PECVD), atomic layer deposition (ALD), etc. Polymer films 106 may be formed by evaporating monomers onto substrate 102 which are further cured by heat or light. However, due to the low heat resistibility of plastic substrate 102, the processing temperature of forming the polymer is limited to, typically, less than 150° C. Further, processing temperature of forming TFT device layer which is generally provided on stacked layer 104 is limited by the processing temperature of stacked layer 104. That is, a TFT device layer on a plastic substrate is generally formed at a lower temperature, for example, a temperature under 150° C. A TFT device formed at low temperature has insufficient device performance and device reliability, and it may not be suitable for controlling liquid crystal of a liquid crystal display or the OLED devices of an OLED display.

To solve the above-mentioned issue, a new structure of a stacked layer on top of a plastic substrate is proposed. Referring to FIG. 2, a stacked layer 204 is provided in top of a plastic substrate 202 to reduce moisture and oxygen penetrating therethrough. Stacked layer 204 may include a plurality of pairs of stacked films. A pair of stacked films includes a first inorganic film 206 and a second inorganic film 208. For example, in FIG. 2, three pairs of first inorganic film 206 and second inorganic film 208 are provided on plastic substrate 202. Inorganic films 206, 208 may be $SiO_2$ and $SiN_x$.

Although these inorganic films can withstand higher temperature to form a TFT device layer, they have drawbacks as well. Most importantly, particles and pin-holes are common during device manufacturing, and a single inorganic layer cannot cover particles or pin-hole completely. Thus, moisture or oxygen can penetrate along the boundary of pin-hole or particles. Typically, very thick inorganic barrier layers are required. Particularly, it may need several pairs of stacked inorganic films to obtain better film coverage and reduce moisture and oxygen penetration. As the films pile up and thickness increases, the internal stress builds up, which may cause the plastic substrate to bend and may compromise the barrier effect of the inorganic films. Moreover, the surface roughness becomes higher with more stacked inorganic films.

Therefore, there is a need to improve the structures of a flexible display to increase the reliability of the flexible display.

SUMMARY OF EMBODIMENTS

Consistent with this disclosure, a substrate-less display device is disclosed. The substrate-less display device includes a barrier stack. The barrier stack includes a plurality of inorganic barrier films and a plurality of polymer films. The inorganic barrier films and the polymer films are alternatively disposed. The substrate-less display device further includes a thin-film-transistor (TFT) device layer disposed on the barrier stack; a display medium layer disposed on the TFT device layer; and an encapsulation layer disposed on the display medium layer. One of the inorganic barrier films is disposed at the outermost of the barrier stack opposing the encapsulation layer.

Consistent with this disclosure, a method of manufacturing a substrate-less display device is disclosed. The method includes forming a barrier stack on a carrier. The barrier stack includes a plurality of inorganic barrier films and a plurality of polymer films. The inorganic barrier films and the polymer films are alternatively disposed. A film of the barrier stack adjacent to the carrier is one of the inorganic barrier films. The method further includes forming a thin-film-transistor (TFT) device layer on the barrier stack; forming a display medium layer on the TFT device layer; forming an encapsulation layer on the display medium layer; and removing the carrier from the barrier stack.

Consistent with this disclosure, a substrate-less display device is disclosed. The substrate-less display device includes a barrier stack. The barrier stack includes a plurality of inorganic barrier films and a plurality of polymer films. The inorganic barrier films and the polymer films are alternatively disposed. A first one of the polymer films is disposed at the lowermost of the barrier stack. The first one of the polymer films is thicker than the other polymer films. The substrate-less display device further includes a thin-film-transistor (TFT) device layer disposed on the barrier stack; a display medium layer disposed on the TFT device layer; and an encapsulation layer disposed on the display medium layer.

Consistent with this disclosure, a method of manufacturing a substrate-less display device is disclosed. The method includes forming a barrier stack. The barrier stack includes a plurality of inorganic barrier films and a plurality of polymer films. The inorganic barrier films and the polymer films are alternatively disposed. A first one of the polymer films is disposed at the lowermost of the barrier stack. The first one of the polymer films is thicker than the other polymer films. The method further includes forming a thin-film-transistor (TFT) device layer on the barrier stack; forming a display medium layer on the TFT device layer; forming an encapsulation layer on the display medium layer; and removing the carrier from the barrier stack.

Consistent with this disclosure, the substrate-less display devices as disclosed above further include a sacrificial layer or adhesion control layer interposed between the carrier and the barrier stack.

BRIEF DESCRIPTION OF THE DRAWINGS

Reference will now be made, by way of example, to the accompanying drawings which show conventional and exemplary embodiments of the present application, and in which.

DESCRIPTION OF EXAMPLE EMBODIMENTS

Hereinafter, embodiments consistent with the disclosure will be described with reference to the drawings.

Figure 1:
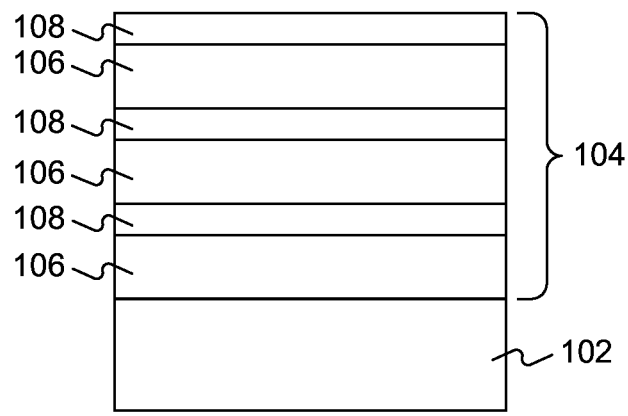
FIG. 1 shows a structure of a conventional plastic substrate.
Figure 2:
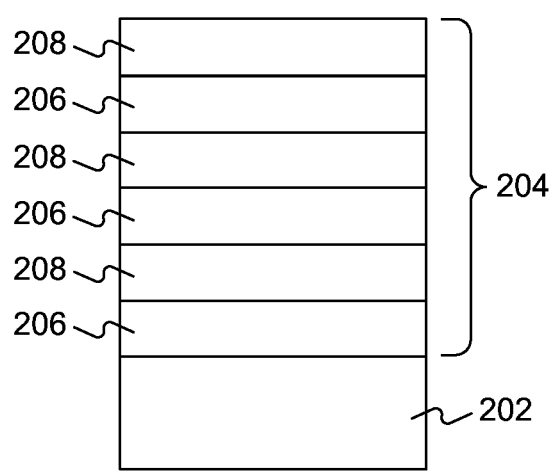
FIG. 2 shows another structure of a conventional plastic substrate.
Figure 3:
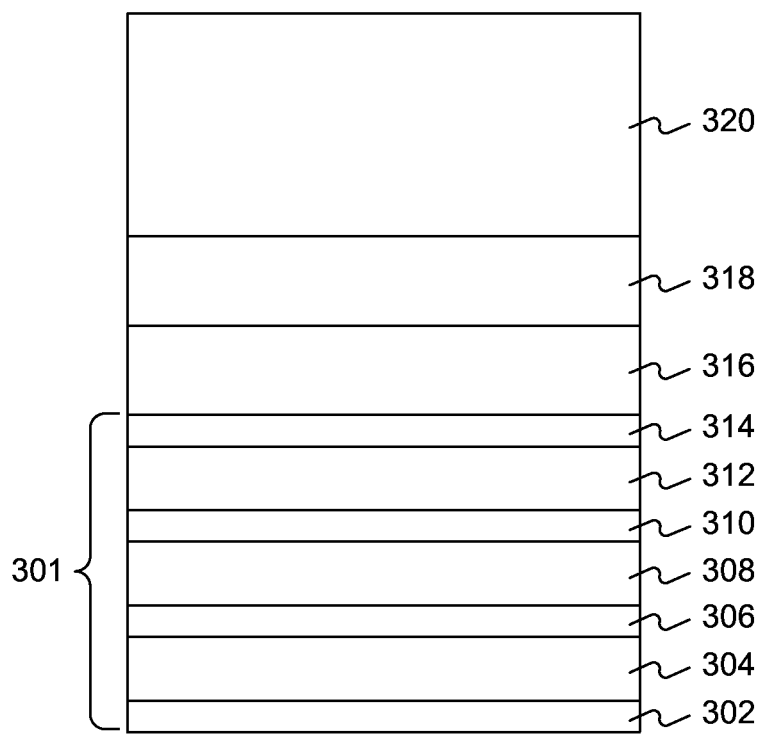
FIG. 3 shows an exemplary display device consistent with some embodiments of this disclosure.

FIG. 3 depicts an exemplary substrate-less display structure 300 consistent with some embodiments of this disclosure. With reference to FIG. 3, display structure 300 includes inorganic barrier films 302, 306, 310, and 314; polymer films 304, 308, and 312 interlaced with inorganic barrier films 302, 306, 310, and 314; a TFT device layer 316, a display medium layer 318, and a top encapsulation 320. Inorganic barrier films 302, 306, 310, and 314, and polymer films 304, 308, and 312 are collectively referred to as barrier stack 301 in FIG. 3. As shown in FIG. 3, inorganic barrier films 302, 306, 310, and 314 and polymer films 304, 308, and 312 are alternatively disposed. Inorganic barrier film 302 is disposed at the outermost of barrier stack 301 opposing the encapsulation layer.

The material of inorganic barrier films 302, 306, 310, and 314 can be one or more of metal, such as Ti, Al, Mo, etc.; or metal oxide, such as $Al_2O_3$, $TiO_2$, or silicon oxide or nitride ($SiO_2$, $SiN_x$); or TiN; or spin on glass (SOG); or spin on dielectric (SOD); or SiC or SiOC, or any combination of the above materials. Each of inorganic barrier films 302, 306, 310, and 314 can be a single layer or multiple layers of the above materials. For example, the bottom barrier film 302 may consist of a layer of Ti and a layer of $TiO_2$. In some embodiments, bottom barrier film 302 may be made of hard materials such as SiC to prevent scratches to display structure 300. In some embodiments, inorganic barrier films 302, 306, 310, and 314 may use different materials. For example, at least one of inorganic barrier films 302, 306, 310, and 314 is of a different material from that of the other inorganic barrier films. For another example, in some embodiments, bottom barrier film 302 is made of SiC while each of barrier films 306, 310, and 314 is made of a stacking of a $SiO_2$ layer and a $SiN_X$ layer.

Inorganic barrier films 302, 306, 310, and 314 may be prepared by sputtering, ALD, chemical vapor deposition (CVD), plasma-enhanced CVD (PECVD), and coating and curing, for example. The thickness of each of inorganic barrier films 302, 306, 310, and 314 may range, for example, from 10 nm to 10 μm, or from 20 nm to 500 nm. In some embodiments, inorganic barrier films 302, 306, 310, and 314 may have same thickness. In some embodiments, the thickness of each of inorganic barrier films 302, 306, 310, and 314 may be different. For example, bottom barrier film 302 may be thicker than other inorganic barrier films 306, 310, and 314 to improve reliability. In some embodiments, inorganic barrier film 314 on which TFT device layer 316 and display-medium layer 318 are disposed may be thicker than inorganic barrier films 306, 310 that are disposed inside barrier stack 301 to prevent diffusion of impurities into the device layers.

The material of polymer films 304, 308, and 312 can be one or more of polyimide, polynorbornene, polyamide, polyethersulfone, polyetherimide, polycarbonate, polyethelene naphthalate, polyester, acrylic polymer, and nylon, for example. Polymer films 304, 308, and 312 can be prepared by coating a layer of these materials. In some embodiments, the coating may be cured. The curing temperature can be higher than 300° C., or about 300-450° C. The thickness of polymer films 304, 308, and 312 can range, for example, from 100 nm to 100 μm, or from 500 nm to 10 μm, or from 1 μm to 7 μm. Each of polymer films 304, 308, and 312 can use different materials and have different thickness.

As shown in FIG. 3, in some embodiments, TFT device layer 316 and display-medium layer 318 are disposed directly on barrier stacks 301. TFT device layer 316 may be disposed directly on inorganic barrier film 314. TFT device layer 316 may include amorphous silicon TFTs, or polysilicon TFTs, or oxide semiconductor TFTs, or organic TFTs. Display-medium layer 318 may be, for example, an OLED device layer, a liquid crystal layer, or an electrophoretic ink layer. Encapsulation 320 is provided to protect TFT device layer 316 and display-medium layer 318 from top side. Encapsulation 320 can be a single barrier layer, or a barrier stack similar to barrier stack 301, or a barrier film with or without barrier adhesive. A person having ordinary skill in the art should appreciate that the number of the polymer films and barrier films are not limited. In some embodiments, the number of these films may be more or less than seven. For example, the display device may have three barrier films and two polymer films sandwiched between the barrier films. As another example, the display device may have two barrier films and one polymer film sandwiched between the barrier films. For a further example, the display device may have nine alternating films (five barrier films and four polymer films alternatively disposed). As shown in FIG. 3, the display device 300 does not have any substrate. Because the display structure 300 includes no substrate, it is more flexible, light-weighted, and thinner than conventional display devices.

Figure 4A:
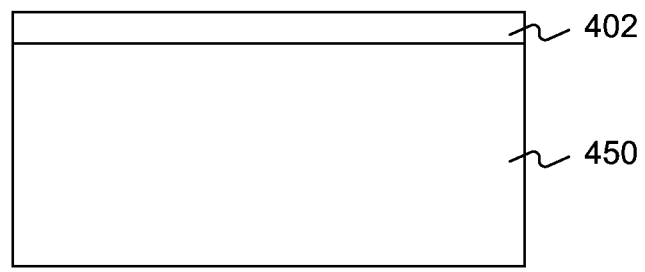
FIGS. 4A-4E depict exemplary methods of forming a display device consistent with some embodiments of this disclosure.

A method to form a display device as shown in FIG. 3 will be explained with accompanying figures. Referring to FIG. 4A, a carrier 450 is provided. Carrier 450 can be a rigid carrier, such as, a glass carrier. A first inorganic barrier film 402 is deposited on carrier 450 by sputtering, ALD, CVD, PECVD, or coating and curing, for example. Barrier film 402 is made of one or more of inorganic materials such as metal, e.g., Ti, Al, Mo, etc.; or metal oxide, such as $Al_2O_3$, $TiO_2$; or silicon oxide or nitride, or TiN; or spin on glass (SOG); or spin on dielectric (SOD); or SiC, SiOC; or any combination of two or more of these materials. Barrier film 402 can be a single layer or multiple layers of the above materials. The thickness of barrier film 402 may range, for example, from 10 nm to 10 μm, or from 20 nm to 500 nm.

Figure 4B:
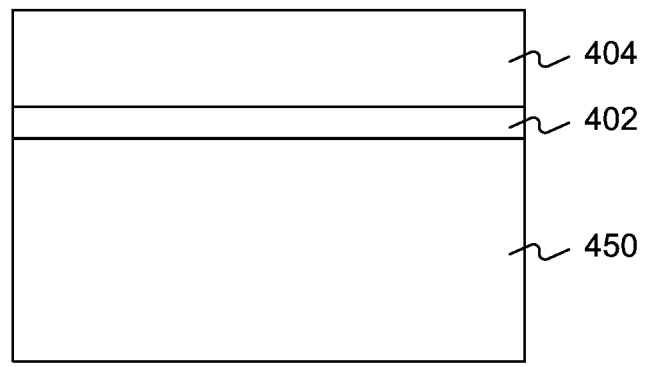

Referring to FIG. 4B, after barrier film 402 is deposited on carrier 450, an organic material, such as a monomer material or polymer material, is deposited on barrier film 402 and cured at a temperature, e.g., more than 200° C., or about 300-450° C., to form a first polymer film 404 by polymerization or crosslinking. Polymer film 404 can be made of polyimide, polynorbornene, polyamide, polyethersulfone, polyetherimide, polycarbonate, polyethelene naphthalate, polyester, acrylic polymer, or nylon, or any combination of two or more of these materials, for example. The thickness of polymer film 404 can range, for example, from 100 nm to 100 μm, or from 500 nm to 10 μm, or from 1 μm to 7 μm.

Figure 4C:
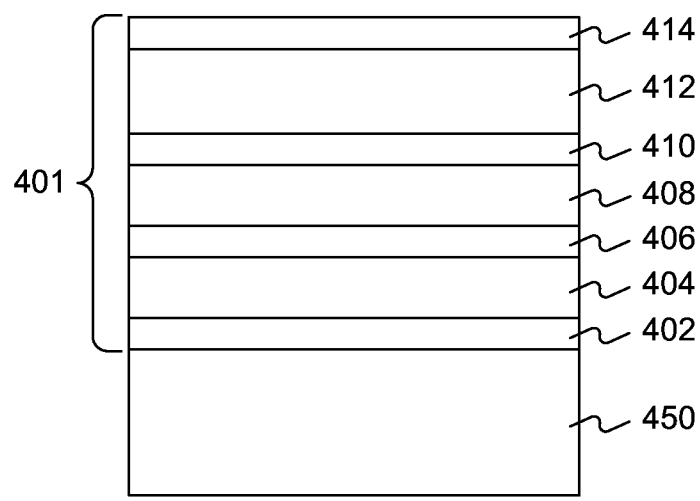

Referring to FIG. 4C, the process steps as described with FIGS. 4A-4B can be repeated until three layers of polymer films 404, 408, 412 are formed to alternate with four inorganic barrier films 402, 406, 410, 414. These polymer films and barrier films are collectively referred to as barrier stack 401. However, the number of the polymer films and inorganic barrier films are not limited. In some embodiments, the number of these films may be more or less than seven. For example, in an application in which light weight is desired, barrier stack 401 may include two layers of polymer films alternating with three layers of inorganic barrier films.

Figure 4D:
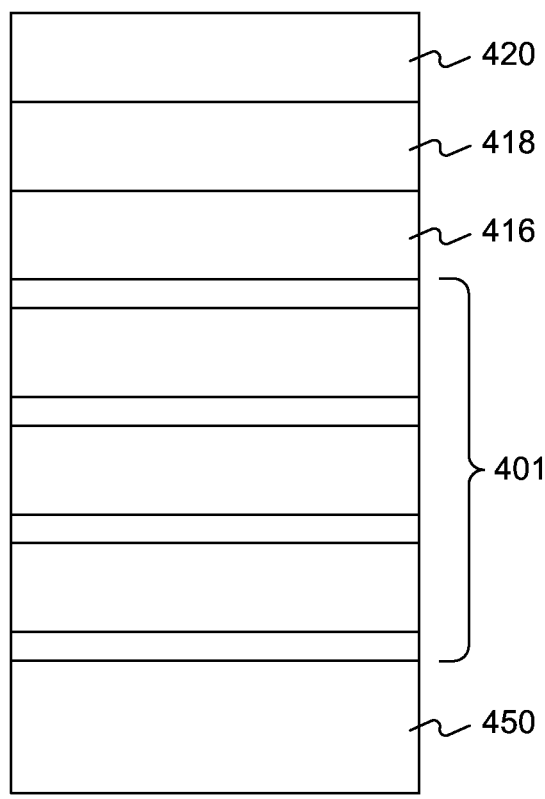
Figure 4E:
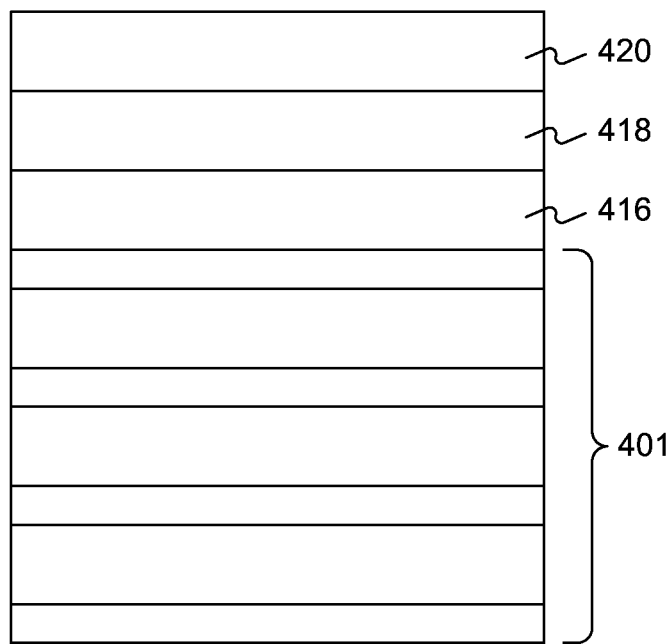

Referring to FIG. 4D, a TFT device layer 416, an OLED device layer, and an encapsulation layer 420 are deposited in that order onto barrier stack 401. Because polymer films 404, 408, 412 are formed at a temperature about or higher than 200° C., TFT device layer 416 can also be formed at a temperature about or higher than 200° C. and thus can have better device performance and reliability. In some embodiments, TFT device layer 416 can be formed at about or higher than 300° C., or 300-450° C. Encapsulation layer 420 can be a single barrier layer, or a barrier stack similar to barrier stack 401, or a barrier film with or without barrier adhesive. Next, referring to FIG. 4E, carrier 450 is removed to form an AMOLED display device 400. Carrier 450 may be removed from AMOLED display 400 by a peeling, or an etching in chemicals, or a chemical-mechanical polishing (CMP) step, or a laser-treatment separation step.

Although AMOLED display device 400 is illustrated above, the display may be a liquid crystal display or an electrophoretic display as OLED device layer 418 is replaced with a layer of liquid crystal or electrophoretic ink.

Figure 5A:
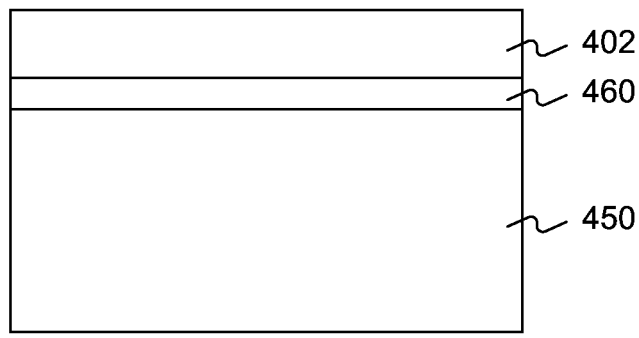
FIG. 5A shows exemplary methods of forming a display device consistent with some embodiments of this disclosure.
Figure 5B:
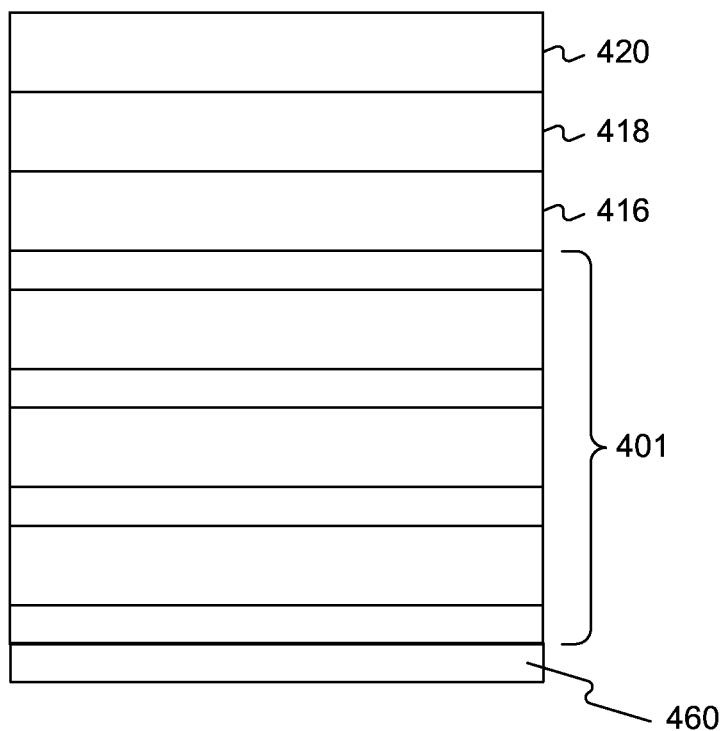
FIG. 5B shows an exemplary display device consistent with some embodiments of this disclosure.

In some embodiments, before the first inorganic barrier film 402 is deposited on carrier 450, a sacrificial layer for facilitating removal of carrier 450 can be provided on carrier 450. For example, FIG. 5A depicts that a sacrificial layer 460 is deposited on carrier 450 and that first inorganic barrier film 402 is deposited on sacrificial layer 460. The rest of the steps of forming an AMOLED display may be similar to those described above regarding FIGS. 4B-4E, and will be omitted. Sacrificial layer 460 can be a single layer or multiple layers of metal oxide, metal, $SiO_2$, glasses, polymers, etc. and can have a thickness of 10 nm to 10 μm, or 20 nm to 1 μm, for example. In the processing step to remove carrier 450, sacrificial layer 460 can facilitate the peeling, the etching, the laser-treatment, or the polishing of carrier 450, thereby reducing processing time. For example, in a process where etching is used to remove carrier 450, the etchant can be selected to react only with sacrificial layer 460, but does not react with other materials in the display device. For another example, in a process where laser is used to remove carrier 450, the laser can be calibrated with right energy and position to attack only the sacrificial layer, but not other materials in the display device. In some embodiments, sacrificial layer 460 is completely removed from AMOLED display 400. In some embodiments, referring to FIG. 5B, a partial layer of sacrificial layer 460 remains on first inorganic barrier film 402 after removing carrier 450.

Figure 5C:
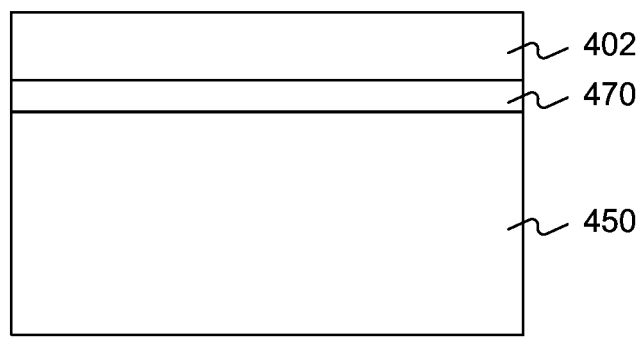
FIG. 5C shows exemplary methods of forming a display device consistent with some embodiments of this disclosure.
Figure 5D:
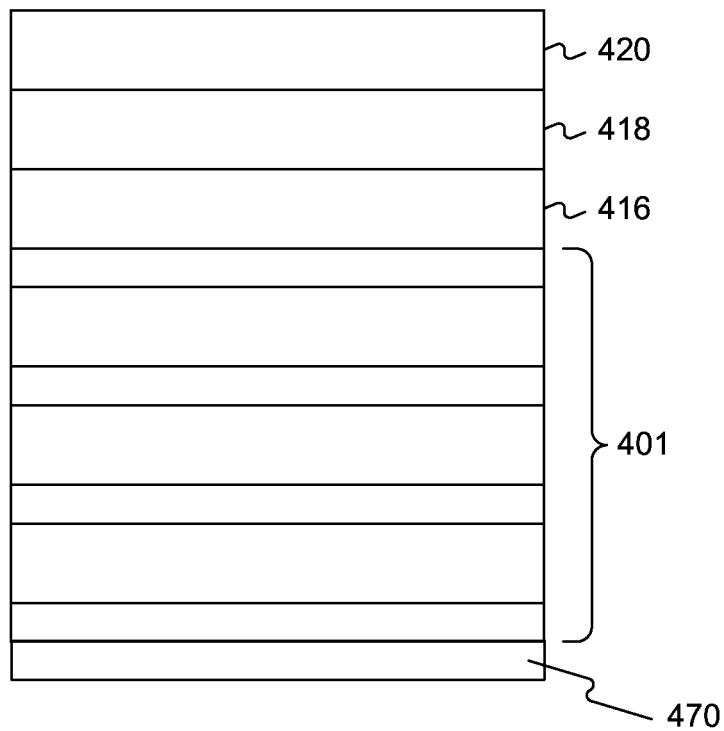
FIG. 5D shows an exemplary display device consistent with some embodiments of this disclosure.

In some embodiments, before the first inorganic barrier film 402 is deposited on carrier 450, an adhesion control layer for facilitating removal of carrier 450 can be provided on carrier 450. For example, FIG. 5C depicts that an adhesion control layer 470 is deposited on carrier 450 and that first inorganic barrier film 402 is deposited on adhesion control layer 470. The rest of the steps of forming an AMOLED display may be similar to those described above regarding FIGS. 4B-4E, and will be omitted. Adhesion control layer 470 can be a layer of organic silane compound, hexamethyldisilazane (HMDS), polymers, etc., or a combination thereof, and have a thickness of 0.1 nm to 1 μm, or 0.1 nm to 100 nm, for example. In the processing step to remove carrier 450, adhesion control layer 470 can facilitate the peeling, the etching, the heat- (e.g., laser-) treatment, or the polishing of carrier 450, thereby reducing processing time. In some embodiments, adhesion control layer 470 is completely removed from AMOLED display 400. In some embodiments, referring to FIG. 5D, adhesion control layer 470 remains on first inorganic barrier film 402 after removing carrier 450.

Figure 6:
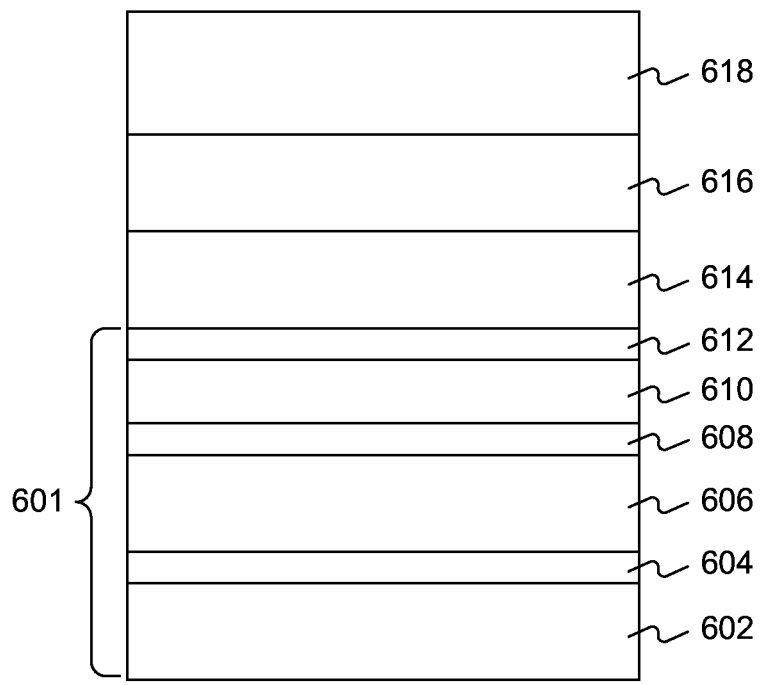
FIG. 6 shows another exemplary display device consistent with some embodiments of this disclosure.

Another exemplary substrate-less AMOLED display structure 600 consistent with some embodiments of this disclosure is depicted in FIG. 6. Referring to FIG. 6, AMOLED display structure 600 includes a barrier stack 601, a TFT device layer 614, an OLED device layer 616 and an encapsulation layer 618. Barrier stack 601 includes three layers of polymer films 602, 606, and 610, and three layers of inorganic barrier films 604, 608, and 612 alternating with polymer films 602, 606, and 610. Polymer film 602 is disposed at the lowermost of barrier stack 601. In some embodiments, the thickness of polymer films 602, 606, and 610 can be the same. In some embodiments, polymer film 602 at the bottom of display structure 600 may be thicker than polymer films 606, 610 and inorganic films 604, 608, and 612 for protecting these internal films. The materials and characteristics of polymer films 602, 606, and 610 and inorganic films 604, 608, and 612 are similar to those of polymer films 304, 308, and 312 and inorganic barrier films 302, 306, 310, and 314 of AMOLED display structure 300 as shown in FIG. 3, and therefore are omitted here.

Figure 7A:
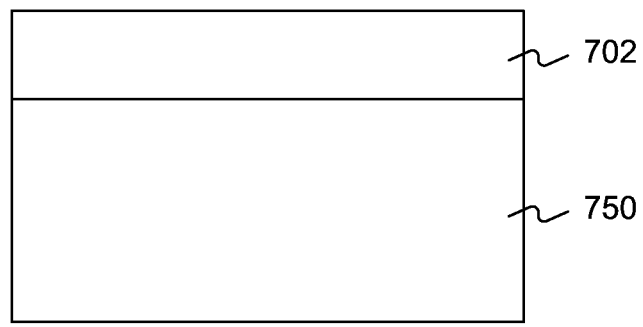
FIGS. 7A-7E depict exemplary methods of forming a display device consistent with some embodiments of this disclosure.

A method to form an AMOLED display device will be explained with accompanying figures. Referring to FIG. 7A, a carrier 750 is provided. Carrier 750 can be a rigid carrier, for example, a glass carrier. An organic material, such as a monomer material or polymer material, is deposited on carrier 750. The deposited material can be cured for polymerization or crosslinking. The curing may be at a temperature, e.g., about or more than 200° C., or about 300-450° C., to form a first polymer film 702. Polymer film 702 can be made of polyimide, polynorbornene, polyamide, polyethersulfone, polyetherimide, polycarbonate, polyethelene naphthalate, polyester, acrylic polymer, or nylon, or any combination of these materials, for example. The thickness of polymer film 702 can range, for example, from 100 nm to 100 μm, or from 500 nm to 10 μm, or from 1 μm to 7 μm.

Figure 7B:
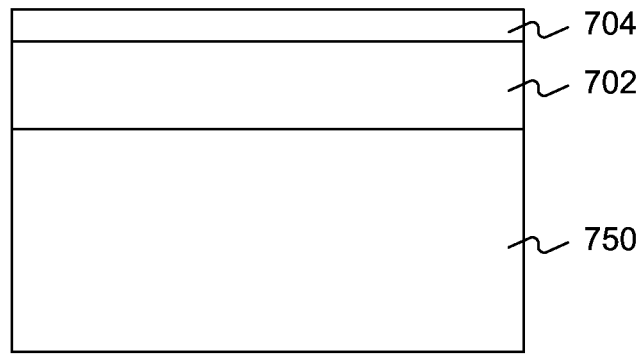

Referring to FIG. 7B, after polymer film 702 is deposited on carrier 750, a first barrier film 704 is deposited on polymer film 702 by sputtering, ALD, CVD, PECVD, or coating and curing, for example. Barrier film 704 is made of one or more of inorganic materials such as metal, e.g., Ti, Al, Mo, etc.; or metal oxide, such as $Al_2O_3$, $TiO_2$; or silicon oxide or nitride; or TiN; or spin on glass (SOG); or spin on dielectric (SOD); or SiC, SiOC, or any combination of the above materials. Barrier film 704 can be a single layer or multiple layers of the above materials. The thickness of barrier films 704 may range, for example, from 10 nm to 10 μm, or from 20 nm to 500 nm.

Figure 7C:
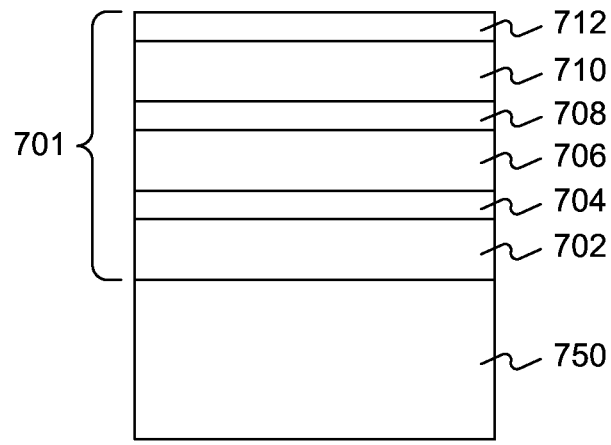

Referring to FIG. 7C, the process steps as described with FIGS. 7A-7B can be repeated until three layers of polymer films 702, 706, 710 are formed to alternate with three layers of inorganic barrier films 704, 708, and 712. These polymer films and barrier films are collectively referred to as barrier stack 701. However, the number of the polymer films and barrier films are not limited. In some embodiments, the number of these films may be more or less than six. For example, in an application in which light weight is desired, barrier stack 701 may include two layers of polymer films alternated with two layers of inorganic barrier films.

Figure 7D:
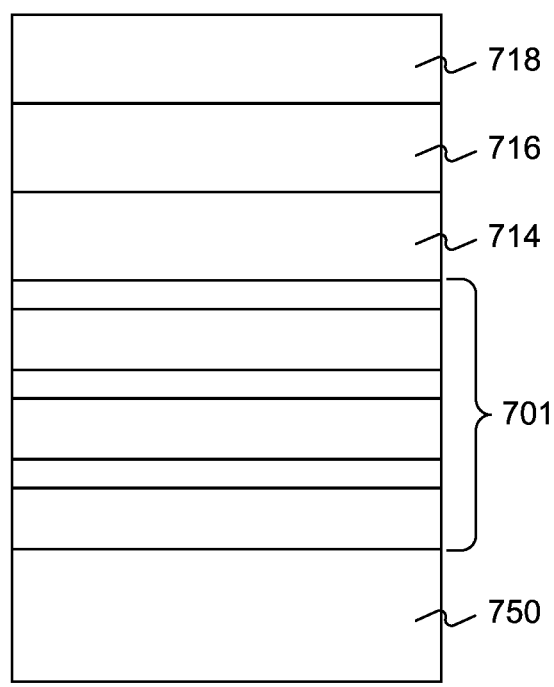
Figure 7E:
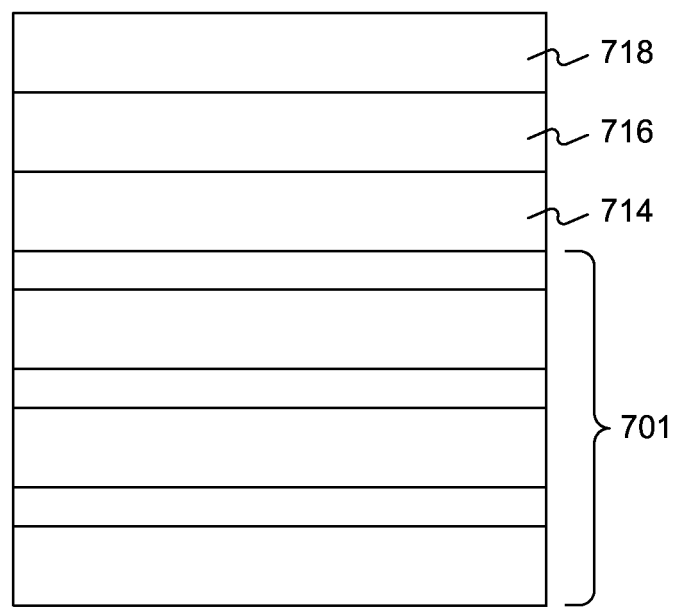

Referring to FIG. 7D, a TFT device layer 714, an OLED device layer 716, and an encapsulation layer 718 are deposited in that order onto barrier stack 701. Because polymer films 702, 706, 710 are formed at a temperature about or higher than 200° C., TFT device layer 714 can also be formed at a temperature about or higher than 200° C. and thus can have better device performance and reliability. In some embodiments, TFT device layer 416 can be formed at about or higher than 300° C., or 300-450° C. Encapsulation layer 718 can a single barrier layer or a barrier stack similar to barrier stack 701. Next, referring to FIG. 7E, carrier 750 is removed to form an AMOLED display 700. Carrier 750 may be removed from AMOLED display 700 by a peeling, or an etching in chemicals, or a CMP step, or a laser-treatment separation step, as discussed above in connection with other embodiments.

Figure 8A:
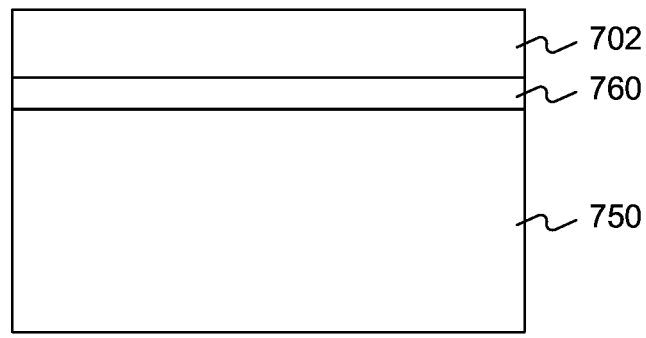
FIG. 8A shows exemplary methods of forming a display device consistent with some embodiments of this disclosure.

In some embodiments, before the first polymer film 702 is deposited on carrier 750, a sacrificial layer for facilitating removal of carrier 750 may be provided on carrier 750. For example, FIG. 8A depicts that sacrificial layer 760 is deposited on carrier 750 and that first polymer film 702 is deposited on sacrificial layer 760. The rest of steps of forming an AMOLED display may be similar to those described above regarding FIGS. 7B-7E, and will be omitted. Sacrificial layer 760 can be a single layer or multiple layers of metal oxide, metal, SiO2, glasses, or polymers, etc. and can have a thickness of 10 nm to 10 μm, or 20 nm to 1 μm, for example. In the processing step to remove carrier 750, sacrificial layer 760 can facilitate the peeling, the etching, the laser-treatment, or the polishing of carrier 750, thereby reducing processing time. In some embodiments, sacrificial layer 760 may be completely removed from AMOLED display 700. In some embodiments, referring to FIG. 8B, a partial layer of sacrificial layer 760 may remain on first polymer film 702 after removing carrier 750.

Figure 8B:
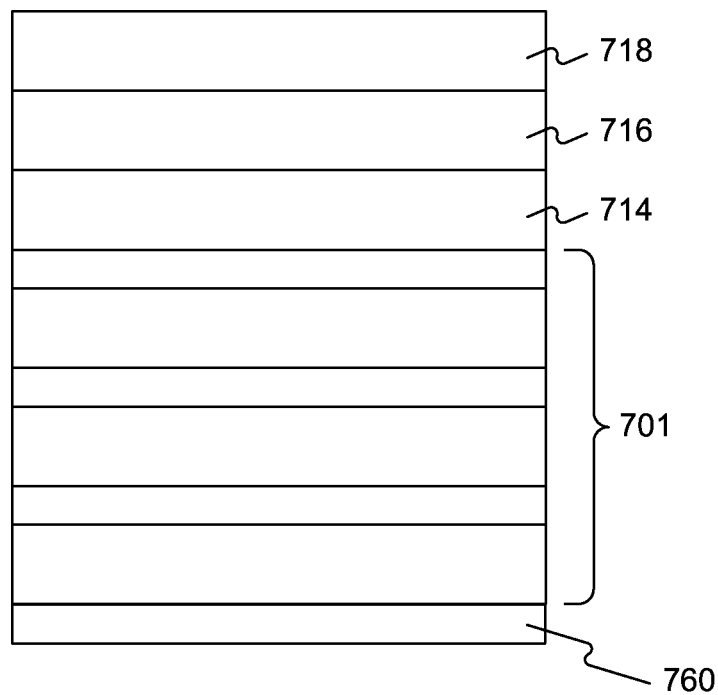
FIG. 8B shows an exemplary display device consistent with some embodiments of this disclosure.
Figure 8C:
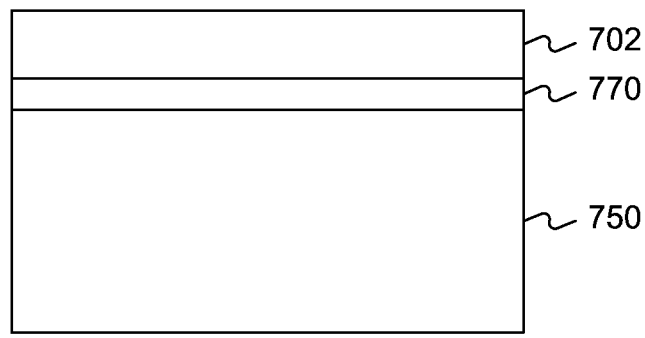
FIG. 8C shows exemplary methods of forming a display device consistent with some embodiments of this disclosure.
Figure 8D:
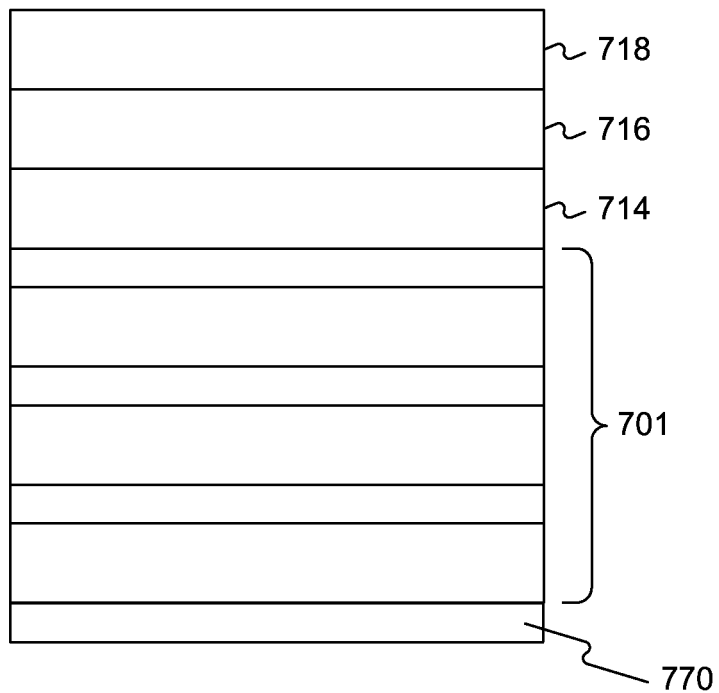
FIG. 8D shows an exemplary display device consistent with some embodiments of this disclosure.

In some embodiments, before the first polymer film 702 is deposited on carrier 750, an adhesion control layer for facilitating removal of carrier 750 may be provided on carrier 750. For example, FIG. 8B depicts that adhesion control layer 770 is deposited on carrier 750 and that first polymer film 702 is deposited on adhesion control layer 770. The rest of steps of forming an AMOLED display may be similar to those described above regarding FIGS. 7B-7E, and will be omitted. Adhesion control layer 770 can be a layer of organic silane compound, hexamethyldisilazane (HMDS), or polymers, etc., or a combination thereof, and have a thickness of 0.1 nm to 1 μm, or 0.1 nm to 100 nm, for example. In the processing step to remove carrier 750, adhesion control layer 770 can facilitate the peeling, the etching, the heat- (e.g., laser-) treatment, or the polishing of carrier 750, thereby reducing processing time. In some embodiments, adhesion control layer 770 may be completely removed from AMOLED display 700. In some embodiments, referring to FIG. 8D, adhesion control layer 770 may remain on first polymer film 702 after removing carrier 750.

In some embodiments, the OLED layer illustrated above may be replaced with a liquid crystal layer or an electrophoretic ink layer to form a liquid crystal display or an electrophoretic ink display. For example, OLED device layer 616 or 716 can be replaced with a layer of liquid crystal or electrophoretic ink so that display 600 or 700 can be a liquid crystal display or an electrophoretic ink display. Further, the substrate-less configuration can be applied to other kinds of display.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:
1. A substrate-less display device comprising:
   a barrier stack including a plurality of inorganic barrier films and a plurality of polymer films, wherein the inorganic barrier films and the polymer films are alternately disposed, and the barrier stack includes a bottom surface and a top surface;
   a thin-film-transistor (TFT) device layer disposed on the top surface of the barrier stack;
   a display medium layer disposed on the TFT device layer; and an encapsulation layer disposed on the display medium layer;

wherein:

one of the inorganic barrier films is disposed as an outermost layer of the barrier stack opposing the encapsulation layer;

the display device is substrate-less;

the one of the inorganic barrier films is exposed from the bottom surface of the barrier stack, and has a distance from the encapsulation layer greater than a respective distance of any other inorganic barrier film of the plurality of inorganic barrier films; and the one of the inorganic barrier films has a thickness greater than a respective thickness of any other inorganic barrier film of the plurality of inorganic barrier films.

2. The display device according to claim 1, wherein the inorganic barrier films comprise one or more of metal, metal oxide, metal nitride, spin on glass, spin on dielectric, silicon oxide, silicon nitride, or silicon carbide.

3. The display device according to claim 1, wherein the polymer films comprise one or more of polyimide, polynorbornene, polyamide, polyethersulfone, polyetherimide, polycarbonate, polyethelene naphthalate, polyester, acrylic polymer or nylon.

4. The display device according to claim 1, wherein a thickness of the inorganic barrier films ranges from 10 nm to 10 μm.

5. The display device according to claim 1, wherein a thickness of the polymer films ranges from 100 nm to 100 μm.

6. The display device according to claim 1, wherein the display medium layer comprises one of an organic light-emitting diode device layer, a liquid crystal layer, or an electrophoretic ink layer.

7. The display device according to claim 1, wherein the TFT device layer is disposed on one of the inorganic barrier films.

8. The display device according to claim 1, further comprising a sacrificial layer or an adhesion control layer disposed on the one of the inorganic barrier films as the outermost layer of the barrier stack opposing the encapsulation layer.

9. A display device comprising:

a barrier stack including a plurality of inorganic barrier films and a plurality of polymer films, the inorganic barrier films and the polymer films being alternately disposed, and the barrier stack includes a bottom surface and a top surface;

a thin-film-transistor (TFT) device layer disposed on the top surface of the barrier stack;

a display medium layer disposed on the TFT device layer; and an encapsulation layer disposed on the display medium layer, wherein:

one of the inorganic barrier films is disposed as an outermost layer of the barrier stack opposing the encapsulation layer, and exposed from the bottom surface of the barrier stack;

the one of the inorganic barrier films has a distance from the encapsulation layer greater than a respective distance of any other inorganic barrier film of the plurality of inorganic barrier films; and the one of the inorganic barrier films has a thickness greater than a respective thickness of any other inorganic barrier film of the plurality of inorganic barrier films.

10. The display device according to claim 9, wherein the inorganic barrier films comprise one or more of metal, metal oxide, metal nitride, spin on glass, spin on dielectric, silicon oxide, silicon nitride, or silicon carbide.

11. The display device according to claim 9, wherein the polymer films comprise one or more of polyimide, polynorbornene, polyamide, polyethersulfone, polyetherimide, polycarbonate, polyethelene naphthalate, polyester, or nylon.

12. The display device according to claim 9, further comprising a sacrificial layer or an adhesion control layer disposed on a side of the first one of the polymer films that is opposite from the inorganic barrier films.

13. The display device according to claim 9, wherein a thickness of the inorganic films ranges from 10 nm to 10 μm.

14. The display device according to claim 9, wherein a thickness of the polymer films ranges from 100 nm to 100 μm.

15. The display device according to claim 9, wherein display medium layer comprises one of an organic light-emitting diode device layer, a liquid crystal layer, or an electrophoretic ink layer.

16. The display device according to claim 9, wherein the TFT device layer is disposed on one of the inorganic barrier films.

* * * * *